(12) United States Patent
Itou et al.

(10) Patent No.: US 7,939,933 B2
(45) Date of Patent: May 10, 2011

(54) SEMICONDUCTOR DEVICE

(75) Inventors: Kenichi Itou, Osaka (JP); Noboru Takeuchi, Kyoto (JP); Shigetoyo Kawakami, Kyoto (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/537,511

(22) Filed: Aug. 7, 2009

(65) Prior Publication Data

US 2009/0294950 A1 Dec. 3, 2009

Related U.S. Application Data

(60) Continuation of application No. 12/156,892, filed on Jun. 5, 2008, now Pat. No. 7,589,404, which is a division of application No. 11/474,659, filed on Jun. 26, 2006, now Pat. No. 7,397,113, which is a continuation of application No. 10/996,783, filed on Nov. 24, 2004, now Pat. No. 7,132,733, which is a continuation of application No. 10/402,470, filed on Mar. 28, 2003, now Pat. No. 6,841,854.

(30) Foreign Application Priority Data

Apr. 1, 2002 (JP) ................................. 2002-098420

(51) Int. Cl.
*H01L 23/48* (2006.01)
(52) U.S. Cl. ......... 257/696; 257/684; 257/676; 257/666
(58) Field of Classification Search .......... 257/684–686, 257/692–696, 666, 676
See application file for complete search history.

(56) References Cited

U.S. PATENT DOCUMENTS

| 5,900,676 | A | 5/1999 | Kweon et al. |
| 6,081,029 | A | 6/2000 | Yamaguchi |
| 6,166,430 | A | 12/2000 | Yamaguchi |
| 6,204,162 | B1 | 3/2001 | Yonemochi et al. |
| 6,338,984 | B2 | 1/2002 | Minamio et al. |
| 6,396,139 | B1 * | 5/2002 | Huang .......................... 257/696 |

(Continued)

FOREIGN PATENT DOCUMENTS

| JP | 11-74440 | | 3/1999 |
| JP | 2000-299423 | A | 10/2000 |
| JP | 2000-307045 | | 11/2000 |
| JP | 2001-024133 | | 1/2001 |
| JP | 2001-77283 | A | 3/2001 |

(Continued)

*Primary Examiner* — Dung A. Le
(74) *Attorney, Agent, or Firm* — Hamre, Schumann, Mueller & Larson, P.C.

(57) ABSTRACT

A semiconductor device includes: a semiconductor element; a die pad with the semiconductor element mounted thereon; a plurality of electrode terminals each having a connecting portion electrically connected with the semiconductor element; and a sealing resin for sealing the semiconductor element, the die pad and the electrode terminals so that a surface of each electrode terminal on an opposite side from a surface having the connecting portion is exposed as an external terminal surface. A recess having a planar shape of a circle is formed on the surface of each electrode terminal with the connecting portion, and the recess is arranged between an end portion of the electrode terminal exposed from an outer edge side face of the sealing resin and the connecting portion. While a function of the configuration for suppressing the peeling between the electrode terminal and the sealing resin can be maintained by mitigating an external force applied to the electrode terminal, the semiconductor device can be downsized.

2 Claims, 15 Drawing Sheets

U.S. PATENT DOCUMENTS

| | | |
|---|---|---|
| 6,400,004 B1 | 6/2002 | Fan et al. |
| 6,483,178 B1 | 11/2002 | Chuang |
| 6,642,609 B1 | 11/2003 | Minamio et al. |
| 6,841,854 B2 | 1/2005 | Itou et al. |
| 6,882,048 B2 | 4/2005 | Ikenaga et al. |
| 6,967,396 B1 | 11/2005 | Shibata |
| 7,132,733 B2 | 11/2006 | Itou et al. |
| 7,397,113 B2 | 7/2008 | Itou et al. |
| 7,589,404 B2 | 9/2009 | Itou et al. |
| 2003/0001249 A1 | 1/2003 | Shimanuki |

FOREIGN PATENT DOCUMENTS

| | | |
|---|---|---|
| JP | 2001-189402 A | 7/2001 |
| JP | 2001-345413 | 12/2001 |
| WO | WO 99/00826 | 1/1990 |
| WO | WO 01/03186 A1 | 1/2001 |

* cited by examiner

SEMICONDUCTOR DEVICE

The present application is a continuation of Ser. No. 12/156,892, filed Jun. 5, 2008, which is a division of U.S. application Ser. No. 11/474,659, filed Jun. 26, 2006, which is a continuation of U.S. Ser. No. 10/996,783, filed Nov. 24, 2004, which is a continuation of U.S. Ser. No. 10/402,470, filed Mar. 28, 2003, which applications are incorporated herein by reference.

BACKGROUND OF THE INVENTION

1. Field of the Invention

The present invention relates to a surface mounted resin sealing type semiconductor device.

2. Related Background Art

In recent years, a smaller and thinner semiconductor device has been developed to make it commensurate with miniaturized and high-density electronic equipment. As a smaller and thinner resin sealing type semiconductor device, a semiconductor device called "Quad Flat Non-leaded Package (QFN)" or "Small Outline Non-leaded Package (SON)" in which one side is sealed substantially is being developed. As a method for manufacturing such a semiconductor device, in order to reduce an assembly cost, a method in which resin-sealing is conducted collectively with respect to a plurality of semiconductor devices, followed by dicing processing to divide into the individual semiconductor devices is becoming mainstream.

The following describes the semiconductor device disclosed in JP 11(1999)-74440 A as a conventional example, with reference to FIGS. 15A to C. FIG. 15A is a plan view showing a schematic configuration of the conventional QFN type (SON type) resin sealing type semiconductor device, FIG. 15B is a cross-sectional view and FIG. 15C is a bottom view of the same. In this semiconductor device, an adhesive 3 is applied to a die pad 1 that is supported by a support lead 16, and a semiconductor element 2 is adhered thereon. On the periphery of the die pad 1, a plurality of electrode terminals 5 are disposed, and a top face of each electrode terminal 5 and the semiconductor element 2 are connected electrically with each other via a thin metal wiring 4.

The die pad 1, the semiconductor element 2, the adhesive 3, the thin metal wiring and the electrode terminals 5 are sealed with a sealing resin 7. The support lead 16 is subjected to bending so that the die pad 1 is embedded in the sealing resin 7. The sealing resin 7 is shaped in a quadrilateral flat plate form, and an under surface of the electrode terminal 5 on the reverse side of the surface connected with the semiconductor element 2 is exposed from a bottom face of the sealing resin 7. In addition, an end face of the electrode terminal 5 on the side of an outer edge of the sealing resin 7 is exposed from a side face of the sealing resin 7 continuously from the under surface exposed from the bottom face of the sealing resin 7. At the top of the electrode terminal 5, a groove 6 is formed. The groove 6 is formed so as to reduce the stress generated when dividing into the individual semiconductor devices from a lead frame (not illustrated) and to suppress the peeling between the electrode terminal 5 and the sealing resin 7 due to the stress generated before and after mounting the device into a board, whereby a break in the thin metal wiring 4 can be prevented.

The following describes the conventional example using a method of conducting resin-sealing with respect of a plurality of semiconductor devices and dividing it into the individual semiconductor devices by dicing processing in order to reduce an assembly cost, with reference to FIGS. 16A to C. This device is a conventional QFN type (SON type) resin sealing type semiconductor device. FIG. 16A is a plan view, FIG. 16B is a cross-sectional view and the FIG. 16C is a bottom view of the same. For simplifying the description, the same reference numerals are assigned to elements common to the above-described conventional example to describe them. In this semiconductor device, a support lead 9 is half etched at a rear face thereof so as to be embedded in a sealing resin 7. An end face of the electrode terminal 5 on the side of an outer edge of the sealing resin 7 is exposed from a side face of the sealing resin 7 discontinuously from an under surface exposed from a bottom face of the sealing resin 7. That is to say, as shown in FIG. 16B, a corner of the electrode terminal 5 located at a boundary between the bottom face and the outer end face of the sealing resin 7 is removed so as to form a discontinuously exposed state. As shown in FIG. 16C, for the purpose of making the semiconductor device thinner and enhancing the heat dissipation capability, a rear face of the die pad 1, which is on the opposite side from the semiconductor element-mounting surface, might be exposed from the sealing resin 7.

In these QFN type (SON type) semiconductor devices, one-side sealing is conducted so that the electrode terminals 5 are exposed from the bottom face of the sealing resin 7, which allows the semiconductor devices to be smaller and thinner.

However, in the configuration of the conventional semiconductor devices, the formation of the groove 6 on the electrode terminal 5 by etching causes the width of the groove to expand to an extent corresponding to the thickness of the lead frame. Therefore, the electrode terminal 5 is required to have a length sufficient to secure the groove width, so that there is a limit to shortening of the electrode terminal 5, thus making further miniaturization of the semiconductor device difficult.

Additionally, when a method of conducting the resin-sealing collectively with respect of a plurality of semiconductor devices and dividing it into the individual semiconductor devices by dicing processing is employed in order to reduce an assembly cost, the dicing processing causes metal burrs on the electrode terminal 5. Since these burrs lead to a problem when packaging the device into a board, the corner of the electrode terminal 5 has to be removed so that the electrode terminal 5 is exposed discontinuously from the under surface to the end face, which means that the corner of the electrode terminal 5 is not exposed from the outer edge of the bottom face of the sealing resin 7 as shown in FIGS. 16B and C. In this case, an outer edge portion of the electrode terminal 5 has to be half-etched to be embedded into the sealing resin 7, thus making it quite difficult to shorten the electrode terminal 5.

SUMMARY OF THE INVENTION

In order to cope with the above-described conventional problems, it is an object of the present invention to provide a semiconductor device that allows the suppression of a break in a thin metal wiring caused by the peeling between an electrode terminal and a sealing resin, and enables further miniaturization of the semiconductor device by shortening the electrode terminal, and provide a method for manufacturing the same.

The semiconductor device according to the present invention includes: a semiconductor element; a die pad on which the semiconductor element is mounted; a plurality of electrode terminals, each of which has a connecting portion electrically connected with the semiconductor element; and a sealing resin for sealing the semiconductor element, the die pad and the electrode terminals so that a surface of each of the plurality of electrode terminals on an opposite side from a surface having the connecting portion is exposed from the sealing resin as an external terminal surface. A recess having a planar shape of a circle is formed on the surface of each of the electrode terminals with the connecting portion, and the recess is arranged between an end portion of the electrode terminal exposed from an outer edge side face of the sealing resin and the connecting portion.

BRIEF DESCRIPTION OF THE DRAWINGS

FIG. 9A is a plan view showing a surface-side resist pattern for etching, FIG. 9B is a plan view showing a schematic configuration of an electrode terminal, and FIGS. 9C to E are cross-sectional views showing states before etching, during etching and after etching, respectively.

FIG. 10A is a plan view showing a surface-side resist pattern for etching, FIG. 10B is a plan view showing a schematic configuration of an electrode terminal, and FIGS. 10C to E are cross-sectional views showing states before etching, during etching and after etching, respectively.

FIG. 11A is a plan view showing a surface-side resist pattern for etching, FIG. 11B is a plan view showing a schematic configuration of an electrode terminal, and FIGS. 11C to E are cross-sectional views showing states before etching, during etching and after etching, respectively.

DETAILED DESCRIPTION OF THE INVENTION

Figure 1A:
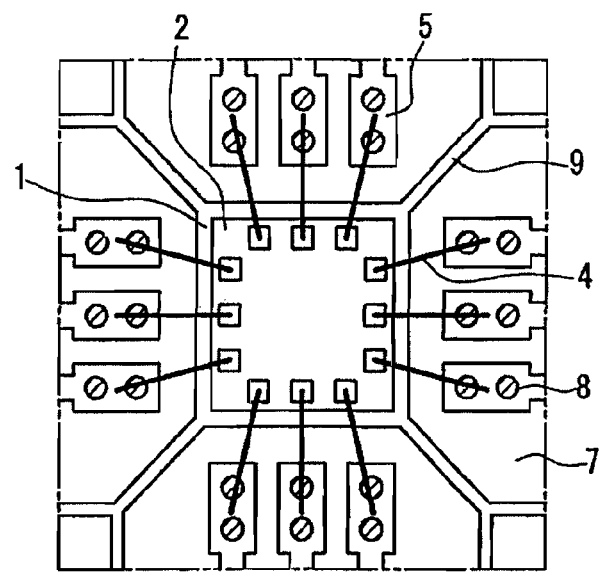
FIG. 1A is a plan view showing a schematic configuration of a semiconductor device according to Embodiment 1.

According to a configuration of a semiconductor device of the present invention, a recess having a planar shape of a circle is formed on a surface of an electrode terminal with a connecting portion as a configuration for mitigating an external force applied to the electrode terminal so as to avoid the peeling between the electrode terminal and a sealing resin. By employing the circular recess, a size of the planar shape of the recess easily can be made smaller to a degree of about half the thickness of a lead frame. This is because when forming the lead frame by etching, since an etchant is retained in the circular recess, the etch rate thereof becomes low, so that the planar shape of the circular recess does not expand. Thereby, while a function of suppressing the peeling between the electrode terminal and the sealing resin can be maintained sufficiently, the electrode terminal can be shortened.

In the above configuration, the recess further may be formed between an end portion of the electrode terminal on a side facing the semiconductor element and the connecting portion. This configuration is effective for alleviating the stress concentration due to the thermal stress into the outer edge of the semiconductor element having high rigidity, when the outer edge of the semiconductor element and the end portion of the electrode terminal are arranged in proximity to each other.

In the above configuration, an end portion of at least one of the electrode terminals may be separated into a plurality of portions to be exposed from an outer edge side face of the sealing resin. With this configuration, the electrode terminal can be supported with a lead frame securely. At the same time, since the exposed surface at the end portion is separated into, for example, two portions, the exposed area can be reduced as compared with the continuously exposed surface, thus mitigating an influence by an external force.

In the above configuration, an end portion of each electrode terminal may have a cross-sectional shape with an inclined or a step shaped end face so that an area of the surface with the connecting portion becomes larger than an area of the external terminal surface.

Electrical connection between the semiconductor element and the electrode terminals can be established by thin metal wirings or metal bumps.

In the above configuration, a plurality of the circular recesses may be arranged continuously in a transverse direction of each of the electrode terminals. With this configuration, the effect for suppressing the peeling between the electrode terminal and the sealing resin can be enhanced. In this case, the circular recesses can be arranged so that adjacent recesses partially overlap each other. In order to enhance the effect for suppressing the peeling between the electrode terminal and the sealing resin, it is effective also to make a planar shape of an end portion of each of the electrode terminals at the surface with the connecting portion in the form of a circular arc.

The following describes semiconductor devices according to embodiments of the present invention and methods for manufacturing the same. In each of the following embodiments, electrode terminals 5 have different configurations, but the same reference numeral will be assigned thereto for the sake of clarity.

EMBODIMENT 1

Figure 1B:
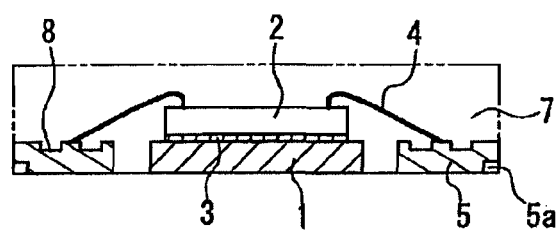
FIG. 1B is a cross-sectional view and FIG. 1C is a bottom view of the same.
Figure 1C:
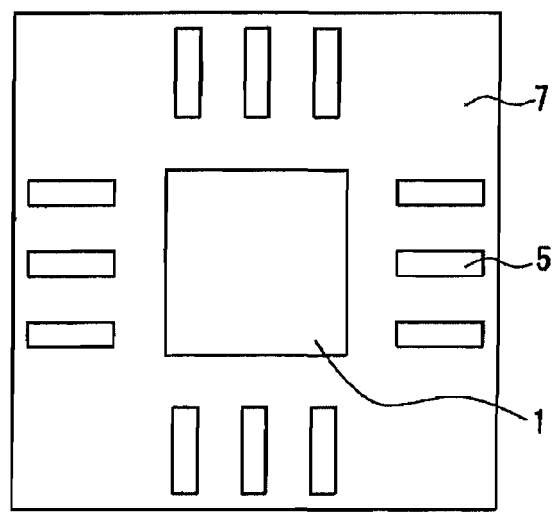

Referring to FIGS. 1A to C, a semiconductor device according to Embodiment 1 will be described below. FIG. 1A is a plan view showing a schematic configuration of the semiconductor device, FIG. 1B is a cross-sectional view and FIG. 1C is a bottom view of the same. In this semiconductor device, an adhesive 3 is applied to a die pad 1 that is supported by a support lead 9, and a semiconductor element 2 is adhered thereon. On the periphery of the die pad 1, a plurality of electrode terminals 5 are disposed. A top face of each electrode terminal 5 has a connecting portion that is connected electrically with the semiconductor element 2 via a thin metal wiring 4.

The die pad 1, the semiconductor element 2, the adhesive 3, the thin metal wiring 4 and the electrode terminals 5 are sealed with a sealing resin 7. The sealing resin 7 is shaped in a quadrilateral flat plate form, and a rear face of the electrode terminal 5 on the opposite side from the surface connected with the semiconductor element 2 is exposed from a bottom face of the sealing resin 7. An end face of the electrode terminal 5 at an outer edge portion of the sealing resin 7 is exposed from a side face of the sealing resin 7 discontinuously from the rear face exposed from a bottom face of the sealing resin 7. That is to say, as shown in FIG. 1B, a corner 5a of the electrode terminal 5 located at a boundary between the bottom face and the outer end face of the sealing resin 7 is removed so as to form a discontinuously exposed state. A support lead 9, as is evident from FIG. 1C, is half etched at a rear face thereof so as to be embedded in the sealing resin 7.

On the surface of the electrode terminal 5 connected with the thin metal wiring 4, a recess 8 having a planar shape of a circle is formed. The recess 8 is arranged at two positions: between the connecting portion connected with the thin metal wiring 4 and the end portion of the electrode terminal 5 exposed from the outer edge side face of the sealing resin 7; and between the connecting portion and the end portion facing the semiconductor element 2. The circular recess 8 functions so as to reduce the stress generated when dividing into the individual semiconductor devices from a lead frame (not illustrated) and to suppress the peeling between the electrode terminal 5 and the sealing resin 7 due to the stress generated before and after mounting the device into a board, whereby a break in the thin metal wiring 4 can be avoided.

By employing the circular recess 8 instead of the conventional groove in order to suppress the peeling, the size of the planar shape of the recess 8 can be made smaller to a degree of about half the thickness of the lead frame. This is because when forming the lead frame by etching, since an etchant is retained in the recess 8, the etch rate thereof becomes low, so that the planar shape of the recess does not expand. Thereby, the peeling between the electrode terminal 5 and the sealing resin 7 can be suppressed, thus realizing a configuration for suppressing a break in the thin metal wiring 4, and at the same time the electrode terminal 5 can be shortened, thus facilitating further miniaturization of the semiconductor device.

As shown in FIG. 1C, for the purpose of making the semiconductor device thinner and enhancing the heat dissipation capability, a rear face of the die pad 1 on the opposite side from the semiconductor device-mounting surface may be exposed from the sealing resin 7. Alternatively, by bending the support lead 9 supporting the die pad 1, the die pad 1 may be embedded in the sealing rein 7 so as not to be exposed from the bottom face of the sealing resin 7 (not illustrated).

Figure 2A:
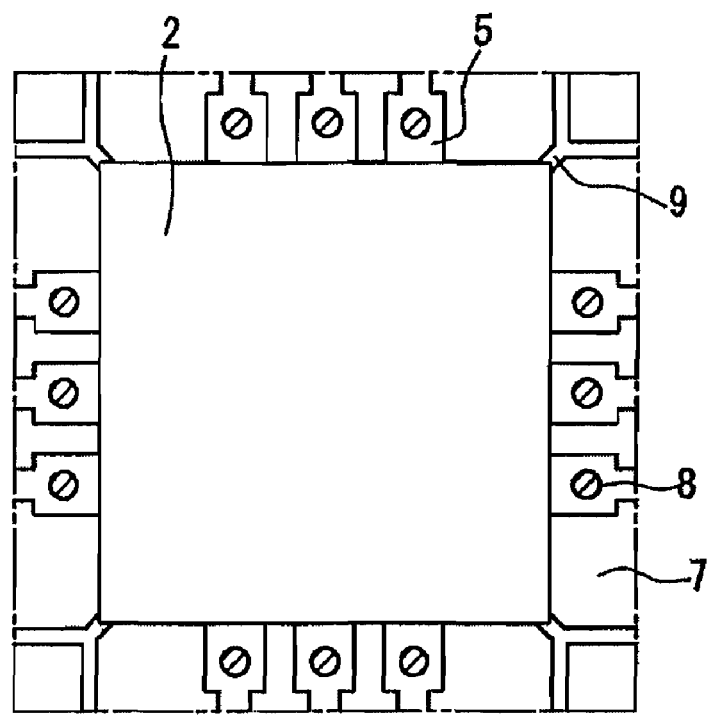
FIG. 2A is a plan view showing a modification of the semiconductor device of FIG. 1
Figure 2B:
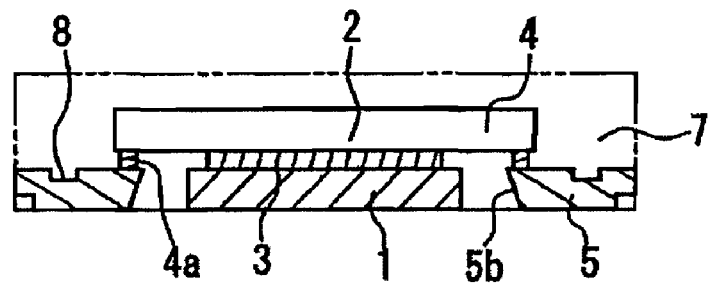
FIG. 2B is a cross-sectional view of the same.

The electrical connection between the semiconductor element 2 and the electrode terminal 5 may be established by means of a metal bump 4a made of Au or solder as shown in FIGS. 2A and B, instead of the thin metal wiring 4 illustrated in FIGS. 1A and B. In addition, as shown in FIG. 2B, the electrode terminal 5 may be shaped to have an inclined plane 5b or a step (not illustrated) at an end face of the cross-sectional shape. With this configuration, an area becomes larger at a surface contributing to the electrical connection than at a surface exposed from the bottom face of the sealing resin 7, so that the adherence between the electrode terminal 5 and the sealing resin 7 further can be enhanced.

Figure 3:
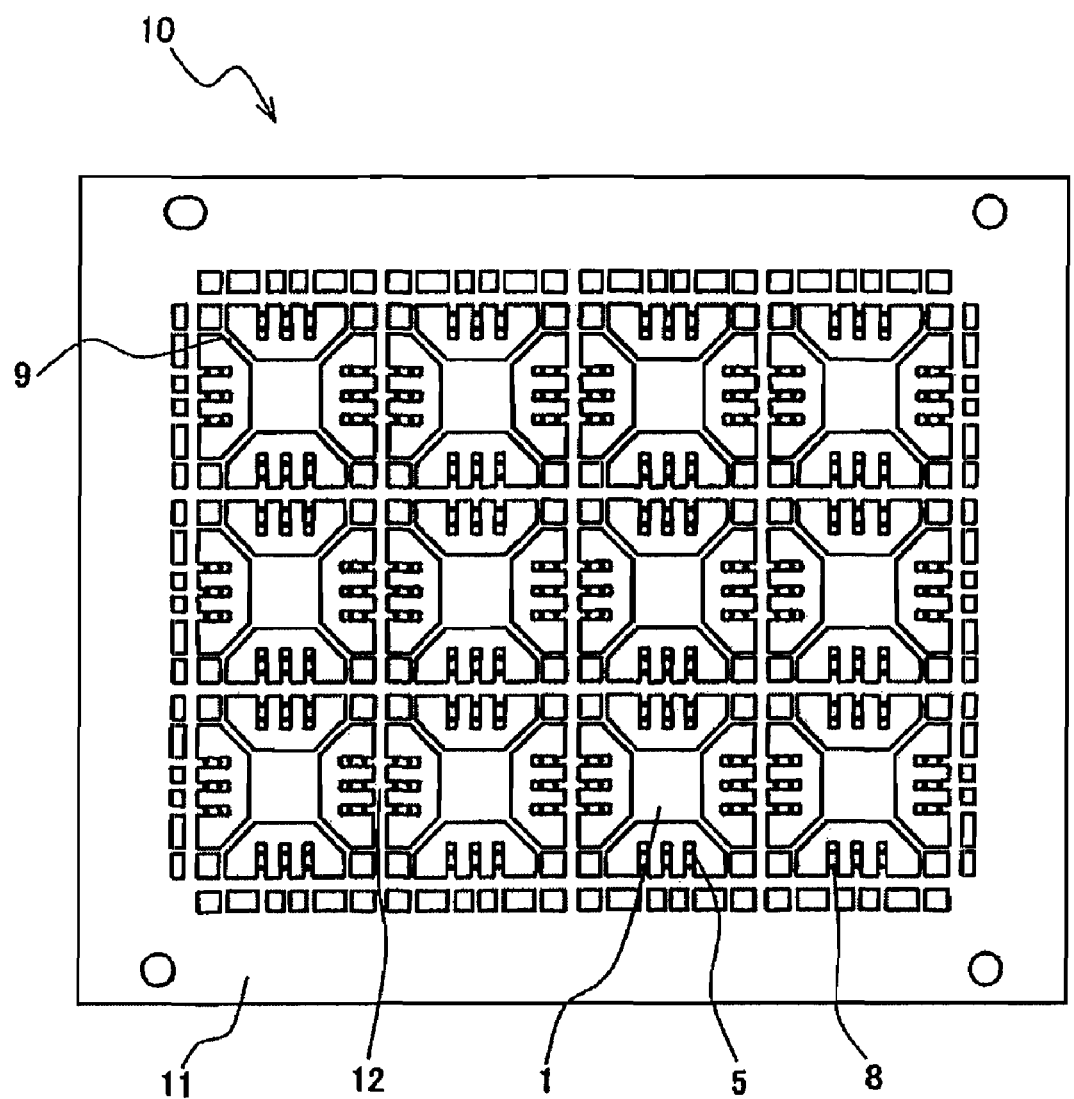
FIG. 3 is a plan view of a lead frame used for manufacturing the semiconductor device of FIG. 1.

FIG. 3 is a plan view of a lead frame 10 used for manufacturing the semiconductor device illustrated in FIGS. 1A to C. In this drawing, reference numerals 11 and 12 denote an outer frame and an inner frame, respectively.

EMBODIMENT 2

Figure 4A:
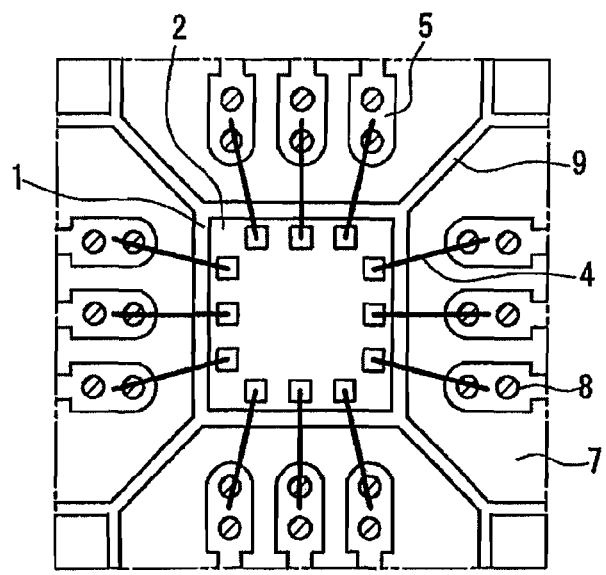
FIG. 4A is a plan view showing a schematic configuration of a semiconductor device according to Embodiment 2.
Figure 4B:
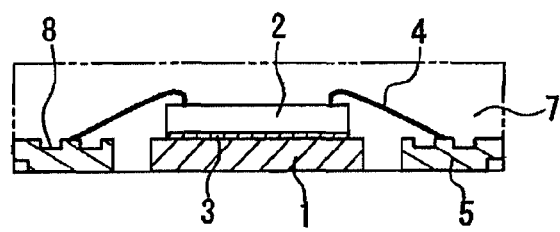
FIG. 4B is a cross-sectional view and FIG. 4C is a bottom view of the same.
Figure 4C:
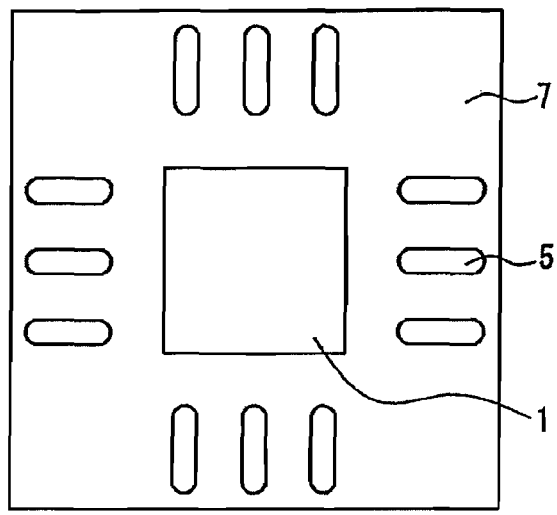

Referring to FIGS. 4A to C, a semiconductor device according to Embodiment 2 will be described below. FIG. 4A is a plan view showing a schematic configuration of the semiconductor device, FIG. 4B is a cross-sectional view and FIG. 4C is a bottom view of the same. Since this semiconductor device has a basic configuration similar to that of the device according to Embodiment 1, the following description will focus on the difference from Embodiment 1. The planar shape of the electrode terminal 5 in the device according to Embodiment 1 is a rectangle, whereas the device of this embodiment has a different planar shape. As shown in FIG. 4A or 4C, an end portion of the electrode terminal 5 facing a semiconductor element 2 is shaped in a form of a circular arc. This configuration can prevent the concentration of the stress generated on the side of the electrode terminal 5 facing the semiconductor element 2. Besides, an area of the electrode terminal 5 in the planar shape becomes smaller, so that the adherence between the electrode terminal 5 and the sealing resin 7 can be enhanced as compared with Embodiment 1, which allows a semiconductor device with better qualities to be provided.

The shape of the portion of the electrode terminal 5 exposed from the bottom face of the sealing resin 7 is not limited to an ellipse as illustrated in FIG. 4C, and only an end portion facing the semiconductor element 2 may be shaped in a form of a circular arc.

EMBODIMENT 3

Figure 5A:
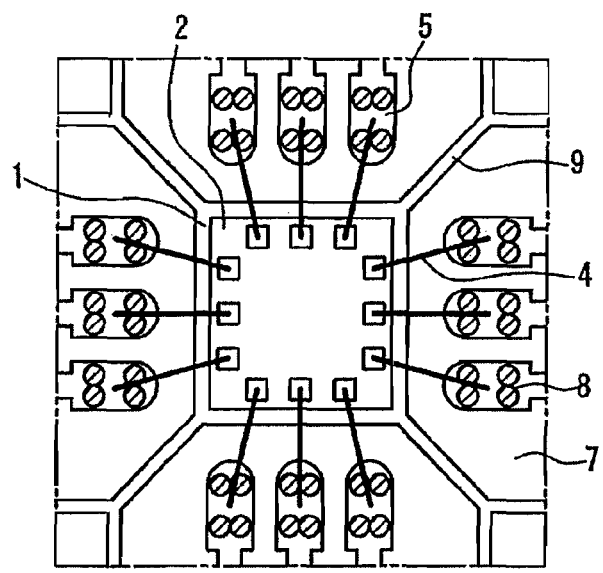
FIG. 5A is a plan view showing a schematic configuration of a semiconductor device according to Embodiment 3.
Figure 5B:
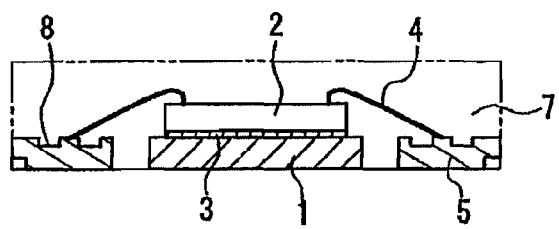
FIG. 5B is a cross-sectional view and FIG. 5C is a bottom view of the same.
Figure 5C:
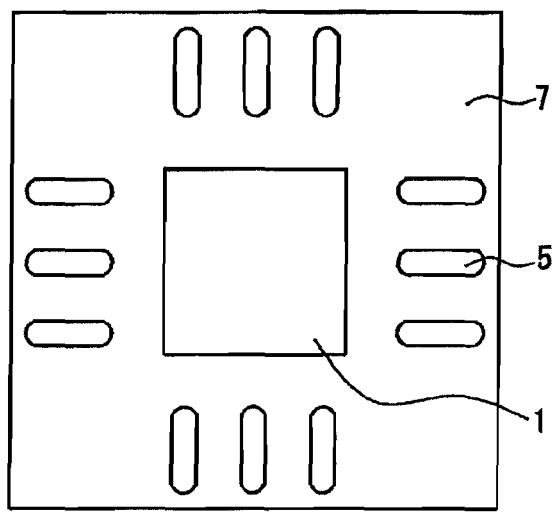

Referring to FIGS. 5A to C, a semiconductor device according to Embodiment 3 will be described below. FIG. 5A is a plan view showing a schematic configuration of the semiconductor device, FIG. 5B is a cross-sectional view and FIG. 5C is a bottom view of the same. Since this semiconductor device has a basic configuration similar to that of the device according to Embodiment 2, the following description will focus on the difference from Embodiment 2. This embodiment is different from Embodiment 2 in the number of circular recesses 8.

In Embodiment 2, at each of the two positions: between the connecting portion connected with the thin metal wiring 4 and the end portion of the electrode terminal 5 exposed from the outer edge side face of the sealing resin 7; and between the connecting portion and the end portion facing the semiconductor element 2, one recess 8 is arranged. In Embodiment 3 on the other hand, at each of the two positions, two circular recesses 8 are provided. These arranged two recesses 8 are formed to be connected with each other at their lateral portions. That is, portions of the circles overlap one another. The width of the overlapped portion of the recesses 8 is smaller than a diameter of the recess 8. Even when the width of the electrode terminal 5 is larger (0.3 mm or more), as compared with Embodiment 2, this configuration can facilitate the miniaturization of the semiconductor device without loss of the effect for suppressing the peeling between the electrode terminal 5 and the sealing resin 7.

EMBODIMENT 4

Figure 6A:
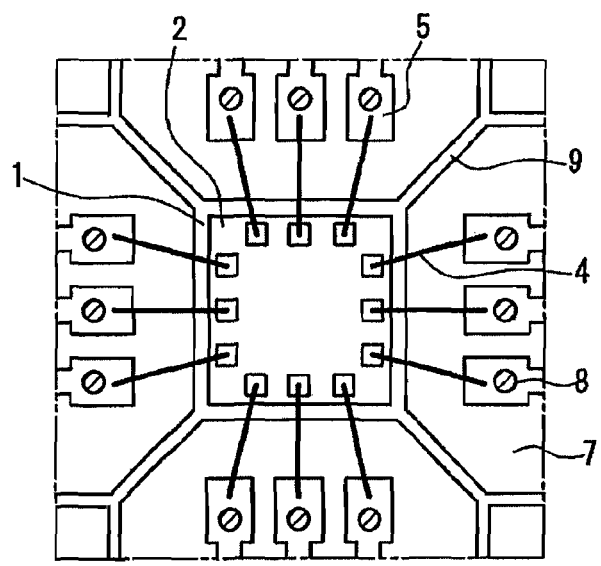
FIG. 6A is a plan view showing a schematic configuration of a semiconductor device according to Embodiment 4.
Figure 6B:
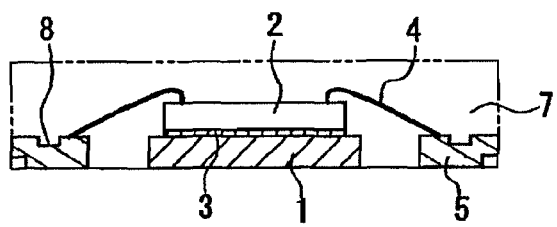
FIG. 6B is a cross-sectional view and FIG. 6C is a bottom view of the same.
Figure 6C:
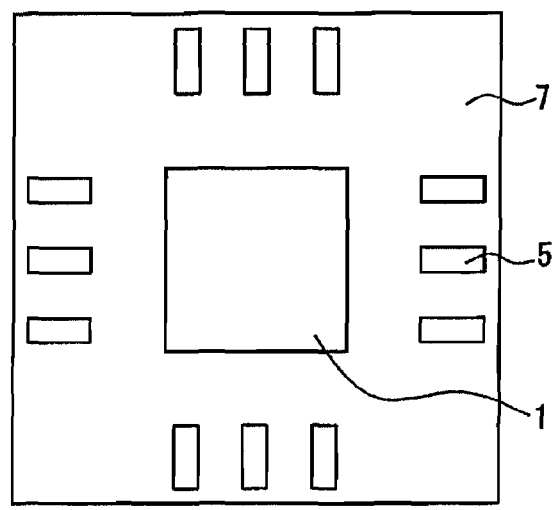

Referring to FIGS. 6A to C, a semiconductor device according to Embodiment 4 will be described below. FIG. 6A is a plan view showing a schematic configuration of the semiconductor device, FIG. 6B is a cross-sectional view and FIG. 6C is a bottom view of the same. Since this semiconductor device has a basic configuration similar to that of the device according to Embodiment 1, the following description will focus on the difference from Embodiment 1. This embodiment is different from Embodiment 1 in the arranged position of the circular recesses 8.

In Embodiment 1, at each of the two positions: between the connecting portion connected with the thin metal wiring 4 and the end portion of the electrode terminal 5 exposed from the outer edge side face of the sealing resin 7; and between the connecting portion and the end portion facing the semiconductor element 2, a recess 8 is arranged. On the other hand, in this embodiment, a recess 8 is arranged only at one position between the connecting portion connected with the thin metal wiring 4 and the end portion of the electrode terminal 5 exposed from the outer edge side face of the sealing resin 7.

In Embodiment 1, the recess 8 on the electrode terminal 5 formed between the connecting portion and the end portion facing the semiconductor element 2 mainly functions so as to alleviate the stress generated when the device is mounted on the board and after the mounting. This function is effective, when the outer edge of the semiconductor element 2 is arranged in proximity to the end portion of the electrode terminal 5 facing the semiconductor element 2, for alleviating the stress concentration due to the thermal stress into the outer edge of the semiconductor element 2 having high rigidity. Whereas, the configuration of this embodiment is suitable for the case where the outer edge of the semiconductor element 2 is not arranged in proximity to the end portion of the electrode terminal 5 facing the semiconductor element 2, but is arranged so as to have a space interval of 200 μm or more therebetween. In such a case, there is no need to provide a circular recess 8 on the electrode terminal 5 between the connecting portion and the end portion facing the semiconductor element 2. As a result, the electrode terminal 5 further can be shortened as compared with Embodiment 1, thus facilitating the miniaturization of the semiconductor device.

EMBODIMENT 5

Figure 7A:
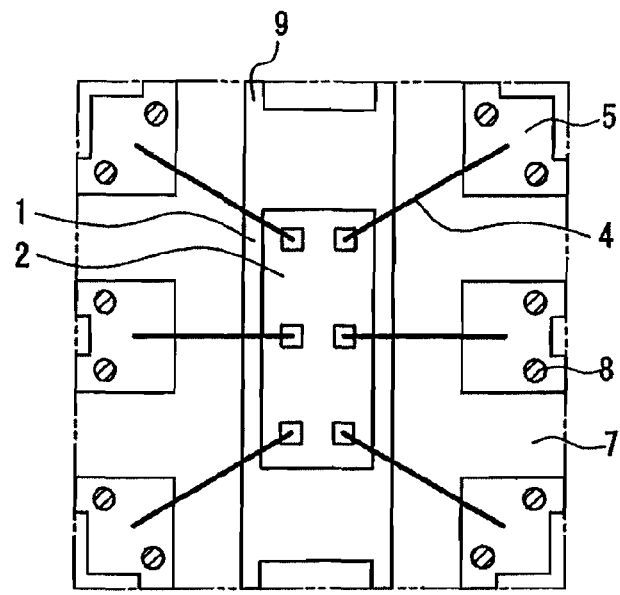
FIG. 7A is a plan view showing a schematic configuration of a semiconductor device according to Embodiment 5.
Figure 7B:
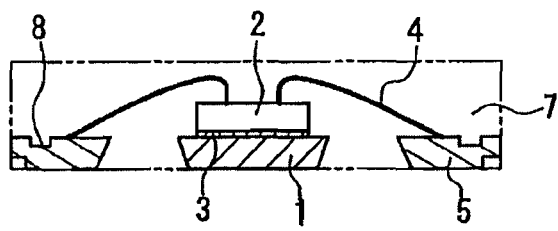
FIG. 7B is a cross-sectional view and FIG. 7C is a bottom view of the same.
Figure 7C:
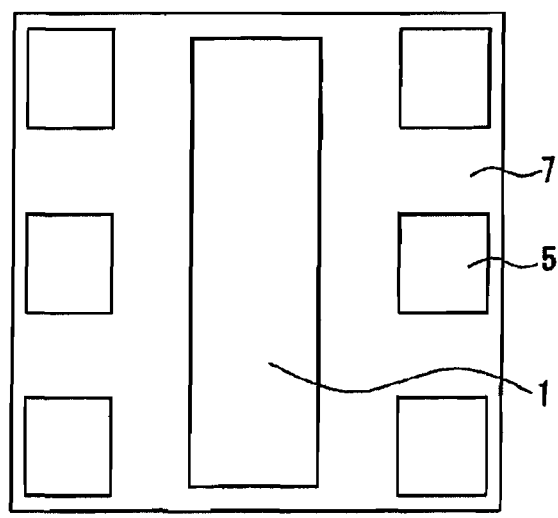

Referring to FIGS. 7A to C, a semiconductor device according to Embodiment 5 will be described below. FIG. 7A is a plan view showing a schematic configuration of the semiconductor device, FIG. 7B is a cross-sectional view and FIG. 7C is a bottom view of the same. The shape of an electrode terminal 5 of this embodiment is wider than those of the above-described embodiments, and an end portion located at an outer edge side face of a sealing resin 7 is separated into two portions to be exposed. Like the device of Embodiment 4, circular recesses 8 are arranged only at a position between the connecting portion connected with the thin metal wiring 4 and the end portion of the electrode terminal 5 exposed from the outer edge side face of the sealing resin 7. However, the respective recesses 8 are arranged so as to correspond to the respective two exposed portions at the end portion of the electrode terminal 5. Note here that although a die pad 1, the semiconductor element 2 and a support lead 9 have different shapes than the above-stated embodiments, the same reference numerals are assigned thereto for the sake of clarity.

This configuration is advantageous when the width of the electrode terminal 5 is large (e.g., 0.4 mm or more) and therefore it is difficult to support the electrode terminal 5 with one position of the end portion of a lead frame, or when the lead frame is so thin that it cannot support the electrode terminal at one position in terms of the strength. With this configuration, the electrode terminal 5 can be supported securely with the end portion and at the same time the divided exposed surface at the end portion allows a reduction in the exposed area as compared with the continuously exposed surface, thus mitigating an influence by an external force. Although this effect is independent of the provision of the circular recess 8, the above-described configuration is suitable for obtaining both of the effects. Therefore, while the effect of suppressing the peeling between the electrode terminal 5 and the sealing resin 7 can be secured sufficiently, the semiconductor device can be miniaturized.

The positions of the end portion of the electrode terminal 5 exposed from the outer edge surface of the sealing resin 7 are not limited to two positions, and a plurality of position may be exposed depending on the shape of the electrode terminal 5.

EMBODIMENT 6

Figure 8A:
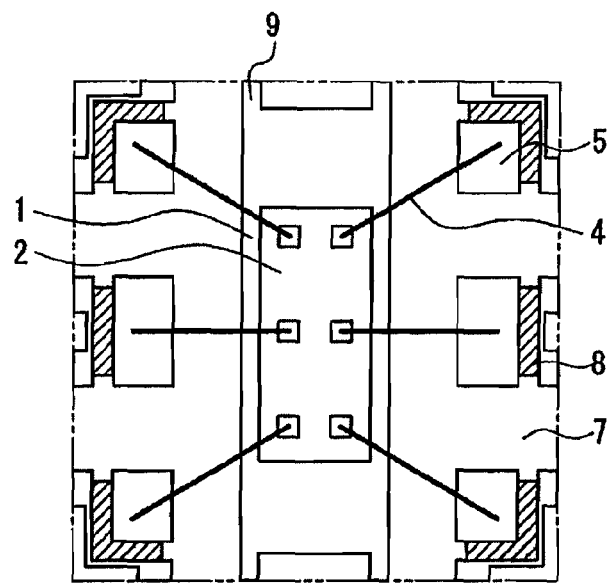
FIG. 8A is a plan view showing a schematic configuration of a semiconductor device according to Embodiment 6.
Figure 8B:
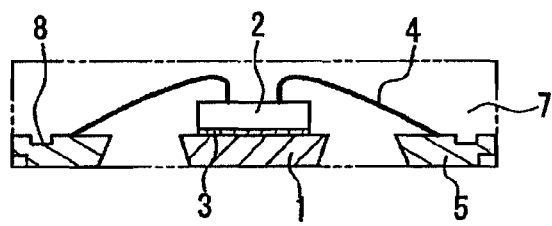
FIG. 8B is a cross-sectional view and FIG. 8C is a bottom view of the same.
Figure 8C:
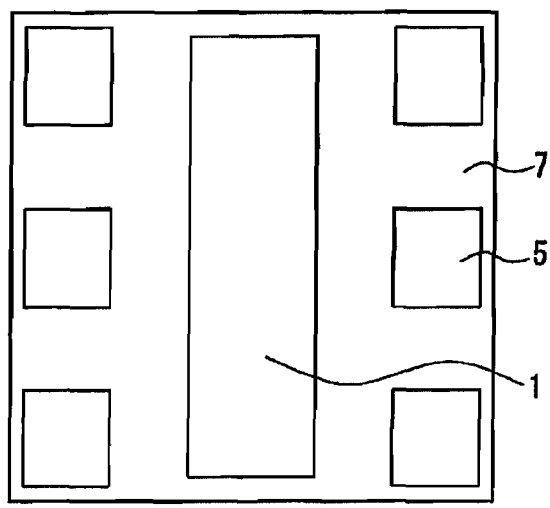

Referring to FIGS. 8A to C, a semiconductor device according to Embodiment 6 will be described below. FIG. 8A is a plan view showing a schematic configuration of the semiconductor device, FIG. 8B is a cross-sectional view and FIG. 8C is a bottom view of the same. Although this semiconductor device has a basic configuration similar to that of the device according to Embodiment 5, a circular recess 8 is arranged in a different manner from Embodiment 5.

In Embodiment 5, the end portion of the electrode terminal 5 is exposed at two positions from the outer edge side face of the sealing resin 7, and one recess 8 is arranged so as to correspond to each of the two exposed end portions. On the other hand, in this embodiment, circular recesses 8 are arranged at a similar position but a plurality of recesses 8 are arranged transversely of the electrode terminal 5 irrespective of the number of portions of the electrode terminal 5 exposed from the sealing resin 7. The plurality of circular recesses 8 are connected so that adjacent recesses partially overlap each other. Although the recesses are illustrated as a groove having a straight-line contour in the drawings, they actually form a groove having a wavy contour configured by partially overlapping the plurality of circles.

With this configuration, a top surface of the electrode terminal 5 is separated completely into two portions by the groove made up of the plurality of connected recesses 8, and therefore the effect of suppressing the peeling between the electrode terminal 5 and the sealing resin 7 is improved.

As shown in FIG. 8A, when a plurality of end portions of the electrode terminal 5 arranged at a corner are exposed from different sides of the sealing resin 7, the groove made up of the plurality of connected circular recesses 8 may be shaped in a general form of a letter L.

The following describes a method for forming an electrode terminal portion of a lead frame that is used for manufacturing the semiconductor devices according to Embodiments 5 and 6 when the lead frame is formed by etching, with reference to FIGS. 9 to 11. FIG. 9 shows a case of the conventional semiconductor device, and FIGS. 10 and 11 show cases of the semiconductor devices of Embodiments 5 and 6, respectively.

Figure 9A:
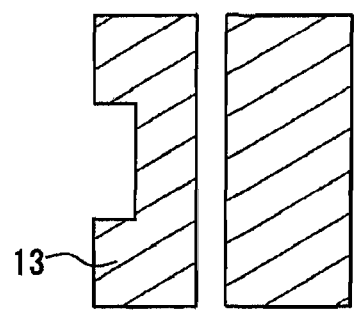
FIGS. 9A to E show a method for manufacturing a lead frame used for manufacturing the conventional semiconductor device, where
Figure 9B:
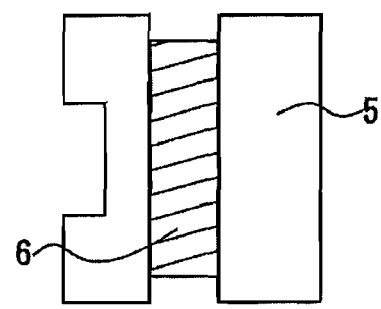
Figure 9C:
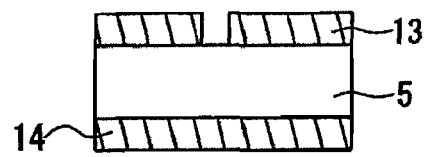
Figure 9D:
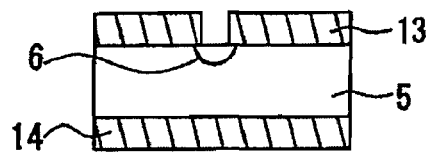
Figure 9E:
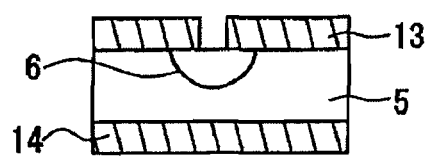
Figure 16A:
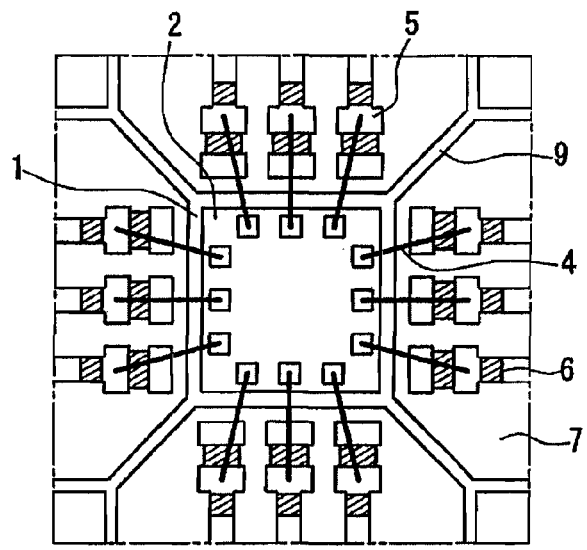
FIG. 16A is a plan view showing a schematic configuration of another conventional semiconductor device.
Figure 16B:
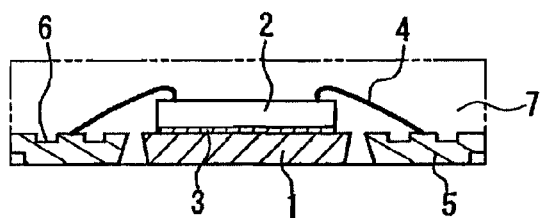
FIG. 16B is a cross-sectional view and FIG. 16C is a bottom view of the same.
Figure 16C:
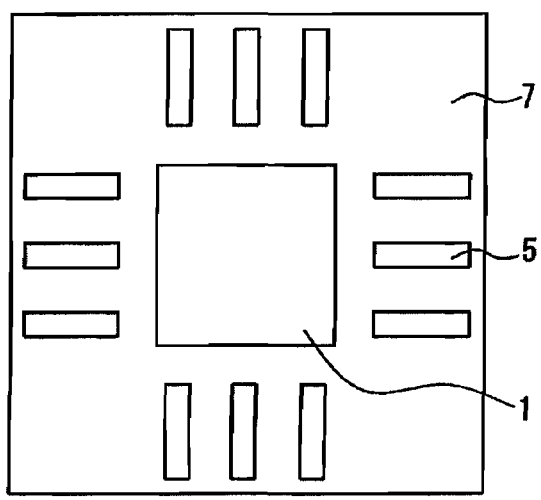

FIG. 9A is a plan view showing a surface-side resist pattern 13 of an electrode terminal portion in the conventional example. FIG. 9B is a plan view showing a schematic configuration of the electrode terminal 5. FIGS. 9C to E are cross-sectional views showing states before etching, during etching and after etching, respectively. For ease of the comparison with the present invention, the conventional example of FIG. 9 illustrates not the shape of the electrode terminal 5 shown in FIG. 16 but the shape similar to those of the electrode terminals 5 of Embodiments 5 and 6.

Figure 10A:
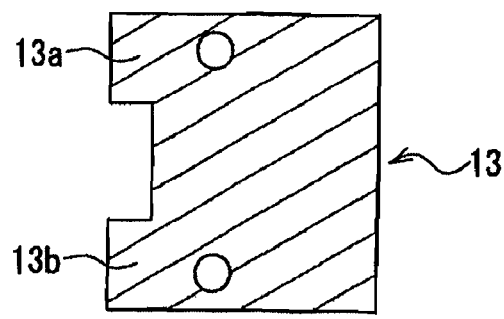
FIGS. 10A to E show a method for manufacturing a lead frame used for manufacturing the semiconductor device according to Embodiment 5, where
Figure 10B:
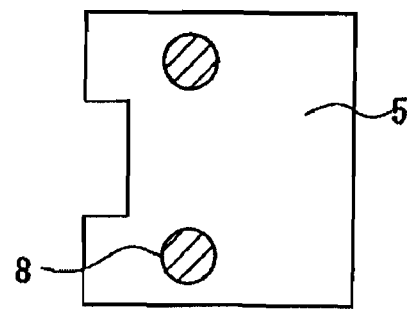
Figure 10C:
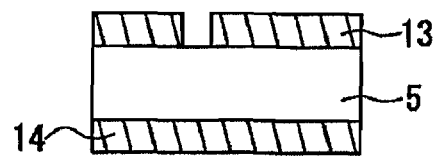
Figure 10D:
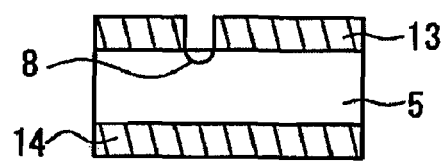
Figure 10E:
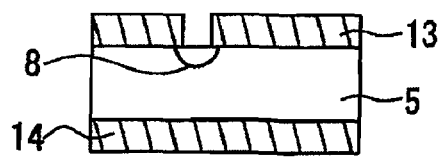

FIG. 10A is a plan view showing a surface-side resist pattern 13 of an electrode terminal portion of Embodiment 5. FIG. 10B is a plan view showing a schematic configuration of the electrode terminal 5. FIGS. 10C to E are cross-sectional views showing states before etching, during etching and after etching, respectively.

Figure 11A:
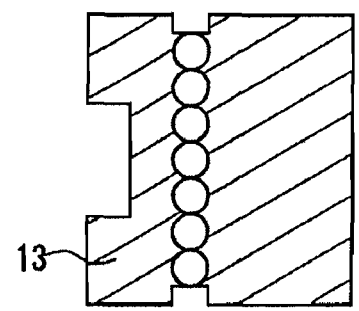
FIGS. 11A to E show a method for manufacturing a lead frame used for manufacturing the semiconductor device according to Embodiment 6, where
Figure 11B:
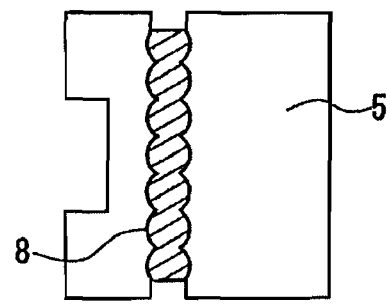
Figure 11C:
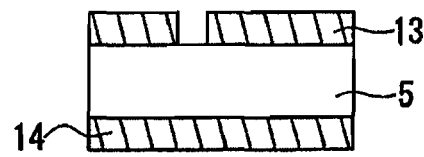
Figure 11D:
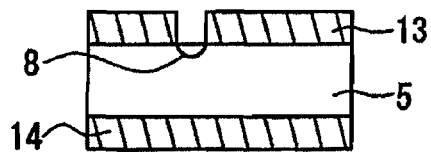
Figure 11E:
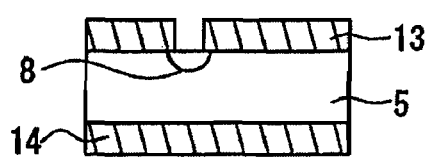

FIG. 11A is a plan view showing a surface-side resist pattern 13 of an electrode terminal portion of Embodiment 6. FIG. 11B is a plan view showing a schematic configuration of the electrode terminal 5. FIGS. 11C to E are cross-sectional views showing states before etching, during etching and after etching, respectively.

When the electrode terminal 5 of the conventional semiconductor device is formed by etching, the surface-side resist pattern 13 having a transverse groove as shown in FIG. 9A and a rear face-side resist pattern 14 (a plan view of the same is not illustrated) are, as shown in FIG. 9C, disposed on both surfaces of the electrode terminal 5. Then, as shown in FIG. 9D, etching is started from the surface side and the rear face side. A portion of the surface-side resist pattern 13 contributing to the formation of the groove 6 is formed to have a uniform width and this portion extends over the width of the electrode terminal 5 from end to end, so that an etchant flows smoothly at this portion. Therefore, as shown in FIG. 9E, the width of the groove 6 becomes larger than the width of the groove portion of the surface-side resist pattern 13. As a result, as shown in FIG. 9B, the groove 6 assumes a width corresponding to the width of the lead frame.

In the case of Embodiment 5, a surface-side resist pattern 13 shown in FIG. 10A is provided with circular patterns for forming the circular recesses 8 so as to correspond to portions 13a and 13b for forming the exposed end portions of the electrode terminal 5. As shown in FIG. 10D, during the etching, since portions to be etched through these circular patterns do not extend over the width of the electrode terminal 5 from end to end, an etchant is retained in the respective circles. Therefore, the etch rate becomes low, and as shown in FIG. 10E, the etching amounts in the radial direction and the depth direction of the circles are less than the conventional example of FIG. 9E. As a result, as shown in FIG. 10B, the size of the recess 8 can be kept small.

In the case of Embodiment 6, a surface-side resist pattern 13 shown in FIG. 11A is provided with circular patterns so as to correspond to the shape of the circular recesses 8 being connected transversely. The circular patterns are arranged so that the outer edges of adjacent circles contact with each other. In this case also, an etchant is retained in the respective circle patterns, and therefore, as shown in FIG. 11E, the etching amounts in the radial direction and the depth direction of the circles are small. As a result, as shown in FIG. 11B, the width of the groove formed with connected recesses 8 can be kept small.

The etching amount of Embodiment 5 is smaller than Embodiment 6, because the etchant is likely to be retained more in the respective circular patterns.

Figure 12A:
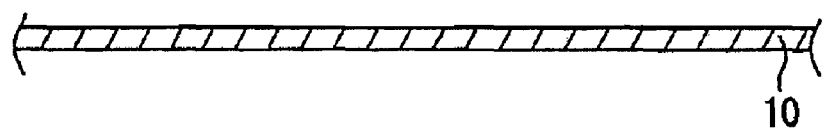
FIGS. 12A to C are cross-sectional views showing a process for manufacturing a lead frame used for manufacturing a semiconductor device according to the present invention.
Figure 12B:
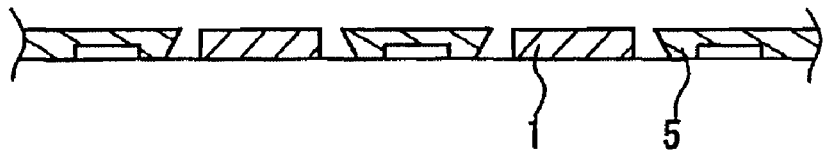
Figure 12C:
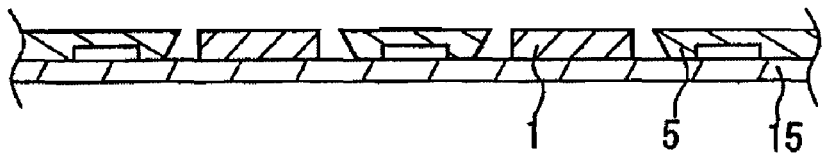

The following describes a process for manufacturing a lead frame used for the semiconductor devices of the present invention, with reference to FIGS. 12A to C. Firstly, as shown in FIG. 12A, a raw material for a lead frame 10 is prepared. As a material of the lead frame, a Cu alloy with a thickness of about 0.1 to 0.2 mm and with relatively good thermal conductivity and a high strength may be used. By using a material with good thermal conductivity, heat generated by the dicing processing can be dissipated easily, and by using a material with a high strength, loading of a blade during the dicing processing can be prevented.

Next, as shown in FIG. 12B, a die pad 1, an electrode terminal 5 and the like are formed with respect to the lead frame material by etching, and a Pd coating (not illustrated) is applied all over the lead frame 10. The Pd coating is made up of three layers including Ni, Pd and Au, and Au flash is applied to the outermost layer, whereby a favorable adherence with the sealing resin can be obtained. During the etching process, a circular recess (not illustrated) is formed on a surface of the electrode terminal 5.

Next, as shown in FIG. 12C, a polyimide tape 15 having a double layer structure including an adhesive such as a thermoplastic adhesive is attached to a rear face of the lead frame 10. This tape 15 is attached so as to, during the sealing with a resin, prevent the resin from running to the rear face of the electrode terminal 5. In this way, the lead frame used for the semiconductor devices of the present invention can be completed.

Figure 13:
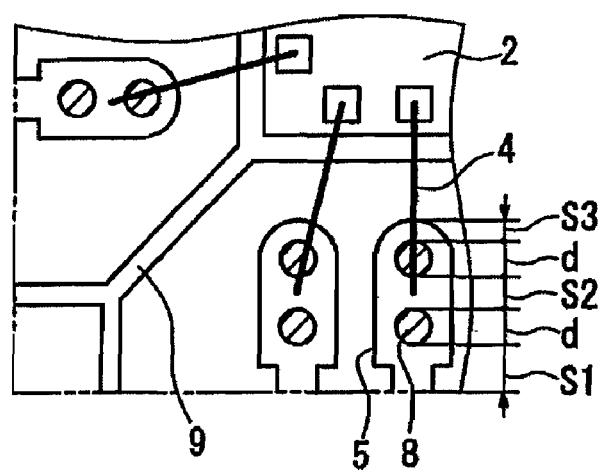
FIG. 13 is an enlarged plan view showing a portion of the electrode terminal of the semiconductor device according to the present invention.

The following describes dimensions such as outer dimensions of the circular recess formed in the process shown in FIG. 12B, with reference to FIG. 13. FIG. 13 is an enlarged plan view showing a portion of the electrode terminal 5. In the case that the lead frame material is 0.2 mm in thickness, the outer diameter d of the recess 8 can be formed to be about 0.1 mm or smaller. Therefore, the electrode terminal 5 correspondingly can be made shorter. As for the position of the outside recess 8, considering, for example, the misalignment during the dicing processing for dividing into the individual semiconductor devices, a distance S1 from the outer edge of the semiconductor device is set at about 0.05 to 0.1 mm. As for the length for connection with the thin metal wiring 4, about 0.1 to 0.2 mm is secured. As a result, in the configuration of the recess 8 being arranged at one position and in the case of the thickness of the lead frame material being 0.2 mm, the length of the electrode terminal 5 can be made 0.25 to 0.4 mm.

As shown in FIG. 13, when a recess 8 is provided also on the side facing the semiconductor element as well as the outside recess 8, a distance S2 between the two recesses 8 is set at 0.1 to 0.2 mm with consideration given to the connection with the thin metal wiring 4. A distance S3 from the recess 8 to the end portion of the electrode terminal 5 facing the semiconductor element 2 is set at about 0.05 to 0.1 mm. As a result, in the case of the thickness of the lead frame material being 0.2 mm, the length of the electrode terminal 5 can be made 0.3 to 0.5 mm.

Figure 14A:
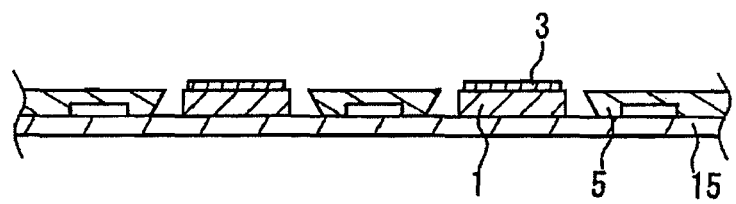
FIGS. 14A to F are cross-sectional views showing a process for manufacturing the semiconductor device of the present invention.
Figure 14B:
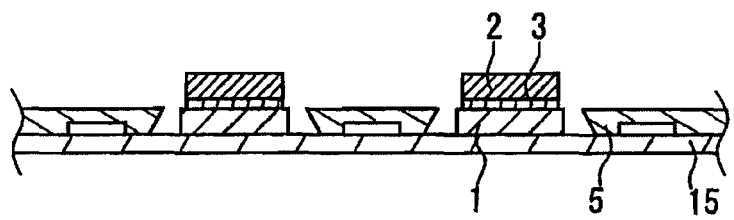
Figure 14C:
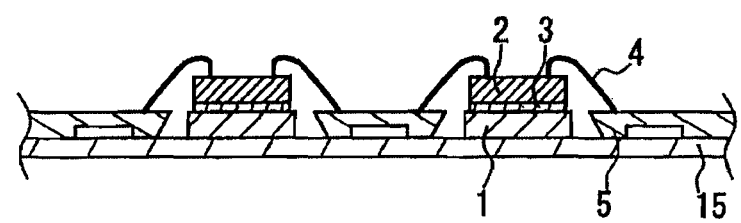
Figure 14D:
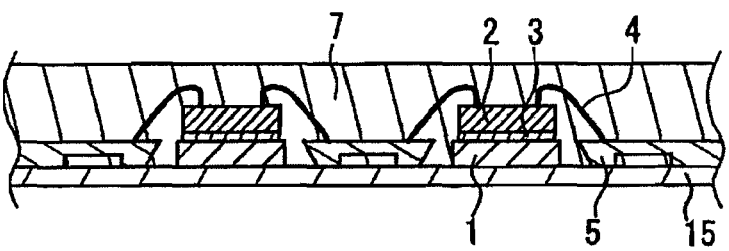
Figure 14E:
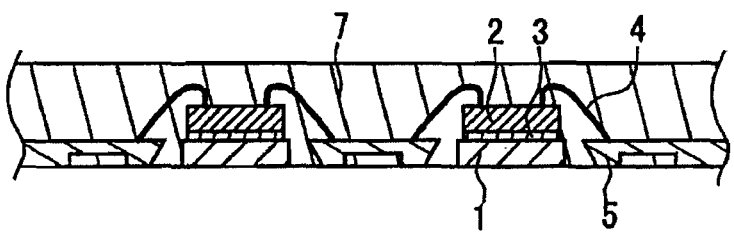
Figure 14F:
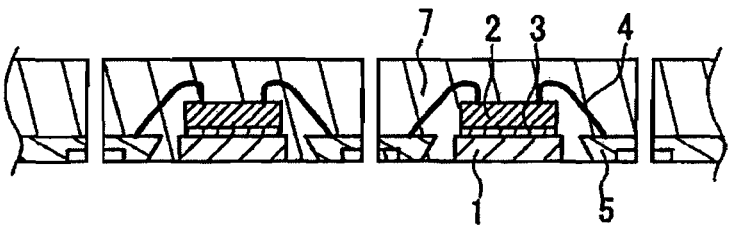
Figure 15A:
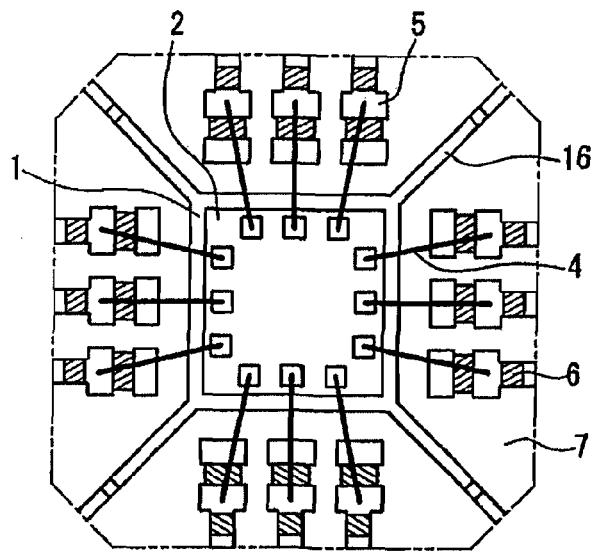
FIG. 15A is a plan view showing a schematic configuration of a conventional semiconductor device.
Figure 15B:
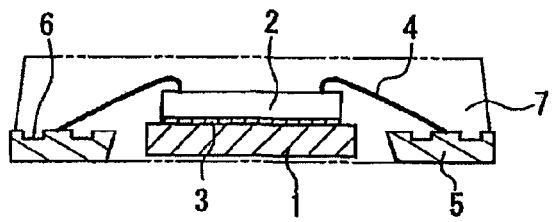
FIG. 15B is a cross-sectional view and FIG. 15C is a bottom view of the same.
Figure 15C:
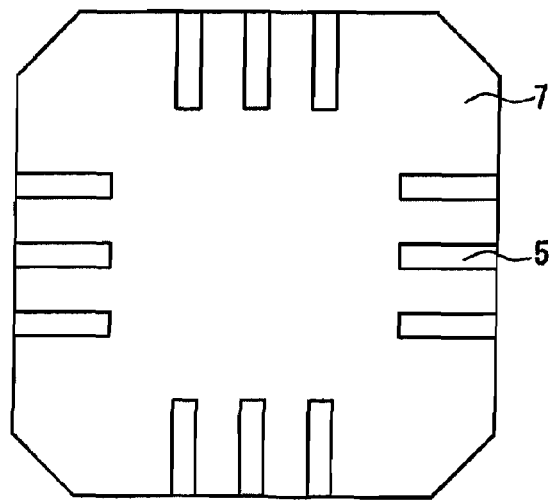

The following describes a process for manufacturing the semiconductor device of the present invention using the above-described lead frame 10, with reference to FIGS. 14A to F. FIG. 14A shows a process of applying an adhesive, FIG. 14B shows a process of mounting a semiconductor element, FIG. 14C shows a process of connecting a thin metal wiring, FIG. 14D shows a process of resin sealing, FIG. 14 E shows a process of peeling a tape from the rear face of the lead frame and FIG. 14F shows a process of dividing into individual semiconductor devices.

Firstly, as shown in FIG. 14A, an adhesive 3 is applied on a die pad 1 by means of a dispenser (not illustrated) or the like. The adhesive 3, for example, includes a silver paste in which Ag powder is mixed with a thermosetting epoxy resin. Next, as shown in FIG. 14B, a semiconductor element 2 is mounted on the die pad 1 to which the adhesive has been applied by means of a collet (not illustrated), followed by heating on a heat stage (not illustrated) to cure the adhesive 3. As one example, the semiconductor element 2 is made of a silicon single crystal with a thickness of about 0.1 to 0.2 mm. The heating condition is, for example, at 200 to 250° C. for 30 to 60 seconds.

Next, as shown in FIG. 14C, a bonding pad (not illustrated) on the semiconductor element 2 adhered onto the die pad 1 and the electrode terminal 5 are connected electrically with each other by means of a thin metal wiring 4. A suction hole is provided in a heat stage (not illustrated) of a wire bonding apparatus, whereby a tape 15 on the rear face of the lead frame is fixed by vacuum. Then, while an outer edge portion of the bonding area of the lead frame is fixed with a retaining jig (not illustrated), wire bonding is conducted. As one example of the thin metal wiring, an Au wire with a diameter of 20 to 25 μm is used.

Next, as shown in FIG. 14D, resin sealing is conducted collectively with respect to a plurality of semiconductor devices using a transfer apparatus equipped with a sealing mold (not illustrated) heated at about 180° C. and clamped with a cylinder. Since the tape 15 is attached to the rear face of the lead frame 10, the sealing resin is prevented from running to the rear face of the electrode terminal 5 during the resin sealing. After the resin is cured to form a sealing resin 7, the mold is opened and the sealing resin 7 is removed from the transfer apparatus. Then, post-curing is conducted on the sealing resin 7 in the curing oven or the like while applying a pressure thereto using a weight or the like. As one example, the applied pressure is about 1 g/mm².

Next, as shown in FIG. 14E, the tape 15 is peeled off from the sealed and molded member while applying heat at about 200° C. In this process, by peeling the tape 15 while keeping an angle with respect to the sealing resin 7 as small as possible, the stress during the peeling can be reduced.

Next, as shown in FIG. 14F, the member is divided into individual semiconductor devices by means of a dicing apparatus (not illustrated). The sealed and molded member is attached to a UV sheet (not illustrated) attached to a ring so as to be fixed, and is cut using a blade. As the blade, for example, a blade made by electroforming and with a thickness of about 0.25 to 0.3 mm is used.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising:
    a semiconductor element;
    a die pad on which the semiconductor element is mounted;
    a plurality of electrode terminals, each of which has a connecting portion electrically connected with the semiconductor element; and
    a sealing resin for sealing the semiconductor element, the die pad and the electrode terminals so that a surface of each of the electrode terminals on an opposite side from a surface having the connecting portion is exposed from the sealing resin as an external terminal surface,
    wherein each of the electrode terminals has an inclined portion or a step portion at an end face of a cross-sectional geometry so that an area of the surface with the connecting portion becomes larger than an area of the external terminal surface, and
    an end portion of the electrode terminal facing the semiconductor element is shaped on a form of a circular arc.

2. The semiconductor device according to claim 1,
    wherein a recess is formed on the surface of each of the electrode terminals, the recess being arranged between an end portion of the electrode terminal exposed from an outer edge side face of the sealing resin and the connecting portion, and
    a lower surface of the electrode terminal directly opposite the recess forms an external terminal for the semiconductor device.

* * * * *